United States Patent [19]
Kishita

[11] Patent Number: 5,656,857
[45] Date of Patent: Aug. 12, 1997

[54] SEMICONDUCTOR DEVICE WITH INSULATING RESIN LAYER AND SUBSTRATE HAVING LOW SHEET RESISTANCE

[75] Inventor: Yoshihiro Kishita, Kawaguchi, Japan

[73] Assignee: Kabushiki Kaisha Toshiba, Kawasaki, Japan

[21] Appl. No.: 439,552

[22] Filed: May 11, 1995

[30] Foreign Application Priority Data

May 12, 1994 [JP] Japan ................................. 6-098373

[51] Int. Cl.$^6$ ........................................ H01L 23/29
[52] U.S. Cl. .................... 257/690; 257/778; 257/790; 257/789; 257/795
[58] Field of Search ................................ 257/659, 660, 257/701, 702, 703, 705, 709, 787, 788, 789, 790, 791, 795

[56] References Cited

U.S. PATENT DOCUMENTS 5,243,223  9/1993  Yamada et al. ..................... 257/795
5,379,186  1/1995  Gold et al. ........................ 257/790

FOREIGN PATENT DOCUMENTS 61-24257   2/1986  Japan ................................. 257/795
1-152750   6/1989  Japan ................................. 257/790
WO94/18707 8/1994  WIPO ................................. 257/659

Primary Examiner—Carl W. Whitehead, Jr.
Attorney, Agent, or Firm—Oblon, Spivak, McClelland, Maier & Neustadt, P.C.

[57] ABSTRACT

A semiconductor device which realize reduction of thickness with maintaining shielding effect has a shielding package having a substrate with a plurality of electrode pattern provided on a surface thereof and side walls upwardly formed in the peripheral end part of the surface thereof, a semiconductor chip having a plurality of electrodes directly connected to the electrode patterns of the shielding package, respectively, an insulating resin layer of a low dielectric constant formed on the substrate enclosed by the side walls so as to cover, and a conductive resin layer formed on an entire surface of the insulating resin layer.

33 Claims, 4 Drawing Sheets

SEMICONDUCTOR DEVICE WITH INSULATING RESIN LAYER AND SUBSTRATE HAVING LOW SHEET RESISTANCE

BACKGROUND OF THE INVENTION

1. Field of the Invention

The present invention relates to a semiconductor device and a method for packaging a semiconductor chip, and more specifically to a method of packaging a semiconductor chip including high frequency transistors or others, for instance.

2. Description of the Background Art

Conventionally, a wire bonding method is so far well known as the method of packaging a semiconductor chip (e.g., IC chip) as a package, as shown in FIGS. 1 and 2, in which FIG. 1 is an internal plan view showing a packaged IC chip, and FIG. 2 is an internal side view thereof.

In more detail, when an IC chip is packaged, first the IC chip 103 is secured with its face up on a ground pattern 102 formed on a surface of a ceramic substrate 101 as shown in FIG. 1. Then, pad portions (aluminum electrodes) 104 of the IC chip 103 are connected to package terminals 105 by bonding, e.g. thermo-compression bonding or ultrasonic bonding, wires 106 such as Au or Al therebetween. After that, the IC chip 103 is sealed with a cap 107 made of ceramic or metal, as shown in FIG. 2. Further, external leads (not shown) are taken out of the package terminals 105 to complete a packaged semiconductor device.

In the above-mentioned conventional packaging method, however, since the IC chip is connected by bonding wires and in addition sealed by the cap, there exists such a problem in that it is difficult to reduce the thickness of the packaged semiconductor device, though the reduction is strongly desired for packaging of chips.

To overcome this problem; that is, to reduce the thickness of the packaged semiconductor device, there has been so far known such a method that an IC chip 112 is mounted on the surface of a substrate 111; electrodes of the IC chip 112 are connected to external leads 113 by wires 114; and all the elements are molded by a resin 115 as a package, as shown in FIG. 3.

In this chip packaging method, however, since the IC chip is molded only by the resin 115 having no shield effect which the ceramic cap or other has, there arises another method in that the IC chip emits radio waves to the outside or is subjected to the influence of radio waves coming from the outside.

As described above, in the prior art semiconductor chip packaging method, it has been impossible to reduce the thickness of the package, without deteriorating the shielding effect.

SUMMARY OF THE INVENTION

With these problems in mind, therefore, it is a primary object of the present invention to provide a semiconductor device which can reduce the thickness of the package with excellent shielding effect.

Further object of the present invention is to provide a semiconductor device having excellent moisture resistance.

Still further object of the present invention is to provide a method for packaging a semiconductor chip which can provide a semiconductor device which can reduce the thickness of the package with excellent shielding effect and moisture resistance.

According to first aspect of the present invention, there is provided a semiconductor device, comprising:

a shielding package having a substrate with a plurality of electrode pattern provided on a surface thereof and side walls upwardly formed in the peripheral end part of the surface thereof;

a semiconductor chip having a plurality of electrodes directly connected to the electrode patterns of said shielding package, respectively;

an insulating resin layer of a low dielectric constant formed on the substrate enclosed by said side walls so as to cover; and a conductive resin layer formed on an entire surface of said insulating resin layer.

According to this device, since the thickness of the package can be determined by the height of the side walls of the shielding package and since the semiconductor chip is covered by the insulating resin of a low dielectric constant, it is possible to reduce the thickness of the package without use of any cap and further to shield the semiconductor chip having high-frequency transistors for prevention of high-frequency noise form being emitted therefrom and to prevent a parasitic capacitance from being produced between two of the electrodes of the semiconductor chip, that is, to prevent the semiconductor chip form being deteriorated in the high-frequency characteristics.

According to second aspect of the present invention, there is provided a semiconductor device, comprising:

a shielding substrate formed with a plurality of electrode patterns on a surface thereof;

a first insulating resin layer of a low dielectric constant formed on said shielding substrate, said first insulating resin layer having an opening therein;

a semiconductor chip having a plurality of electrodes directly connected to the electrode patterns formed on said shielding substrate, respectively, within said opening portion of said first insulating resin layer;

a second insulating resin layer of a low dielectric constant formed at the opening portion of said first insulating resin layer so as to bury said semiconductor chip; and a conductive resin layer for covering said second insulating resin layer at the opening portion of said first insulating resin layer.

According to this device, since the metallic wire formed on the reverse side of the shielding substrate is connected to the electrode pattern formed on the right side of the shielding substrate, it is possible to use the metallic wire as a grounding conductor or a heat radiating conductor.

According to third aspect of the present invention, there is provided a semiconductor device, comprising:

a first shielding substrate formed with electrode patterns and first metallic conductors on a surface thereof;

a second shielding substrate formed on said first shielding substrate, said second shielding substrate being formed with an opening portion and with second metallic conductors connected to the first metallic conductors of said first shielding substrate, respectively;

a first insulating resin layer of a low dielectric constant formed on said second shielding substrate, inner end of the first insulating resin layer being located outside of said opening portion of the second shielding substrate;

a semiconductor chip mounted at the opening portion of said second shielding substrate and having electrodes directly connected to the electrode patterns and the first metallic conductors formed on said first shielding substrate;

a second insulating resin layer of a low dielectric constant formed at the opening portion of said second shielding substrate so as to enclose said semiconductor chip; and a conductive resin for covering said second insulating resin at the opening portion of said second shielding substrate to such an extent as to reach said first insulating resin.

According to this device, since the semiconductor chip is packaged in a double layer substrate, and the first and second metallic wires formed on the first and second ceramic substrates can be used as internal double-layer leads via the second shielding substrate, it is possible to increase the number of leads in double layer structure.

According fourth aspect of the present invention, there is provided a method of packaging a semiconductor chip comprising the steps of:

preparing a shielding package having a substrate with a plurality of electrode pattern provided on a surface thereof and side walls upwardly formed in the peripheral end part of the surface thereof;

directly connecting a plurality of electrodes of a semiconductor chip with the electrode patterns of the shielding package, respectively;

forming an insulating resin of a low dielectric constant so as to cover the semiconductor chip within the shielding package; and forming a conductive resin on an entire surface of the insulating resin.

According to this method, it is possible to reduce the thickness of the package without use of any cap and further to shield the semiconductor chip having high-frequency transistors for prevention of high-frequency noise form being emitted therefrom.

BRIEF DESCRIPTION OF THE DRAWINGS

In the accompanying drawings.

DETAILED DESCRIPTION OF THE EMBODIMENTS

Embodiments of the semiconductor device and the semiconductor chip packaging method according to the present invention will be described hereinbelow with reference to the attached drawings.

Figure 1:
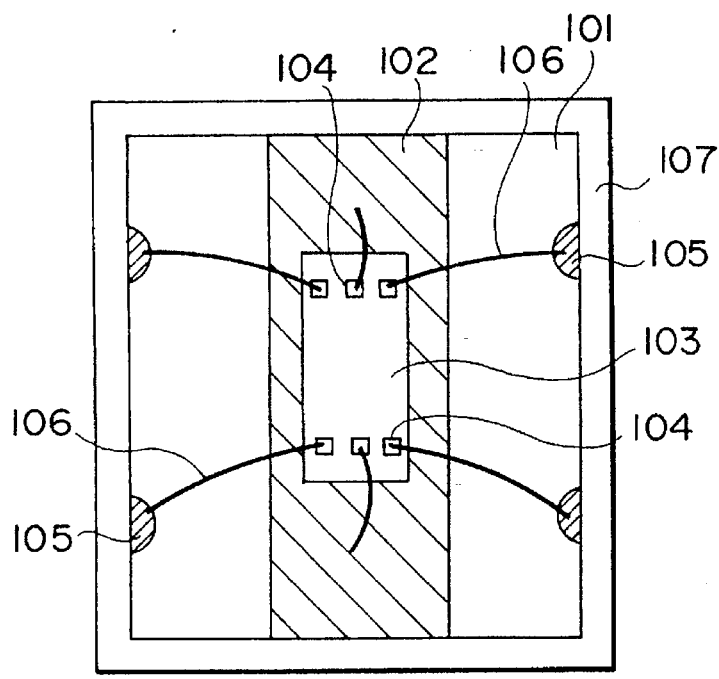
FIG. 1 is an internal plane view showing a conventional packaged IC chip.
Figure 2:
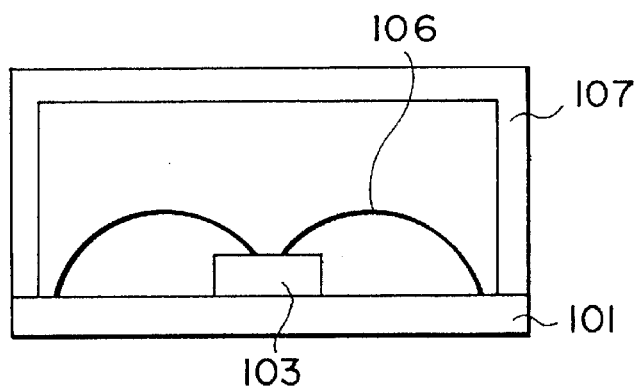
FIG. 2 is an internal side view showing the same conventional packaged IC chip.
Figure 3:
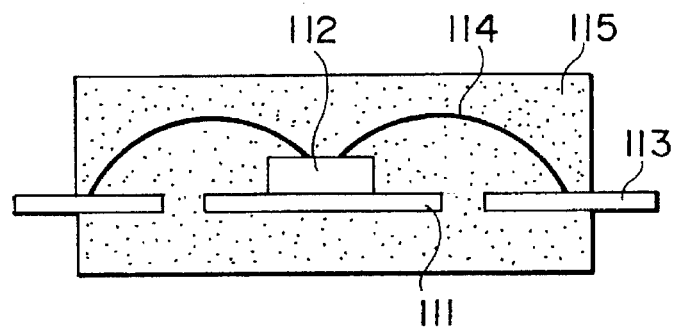
FIG. 3 is a cross-sectional view showing the other conventional packaged IC chip.
Figure 4:
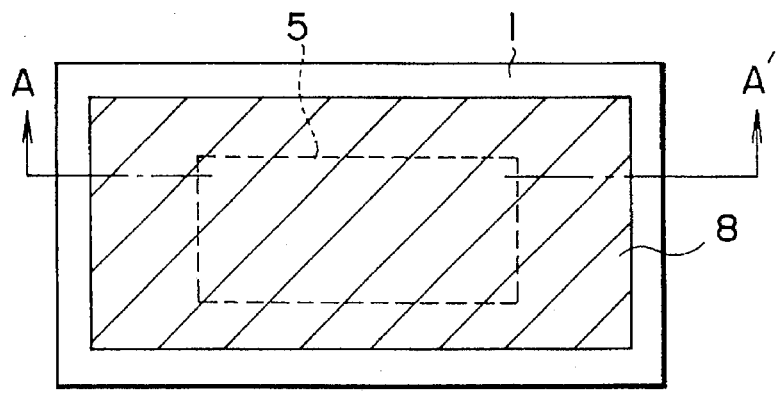
FIG. 4 is a plan view showing the structure of a first embodiment of the semiconductor device according to the present invention.
Figure 5:
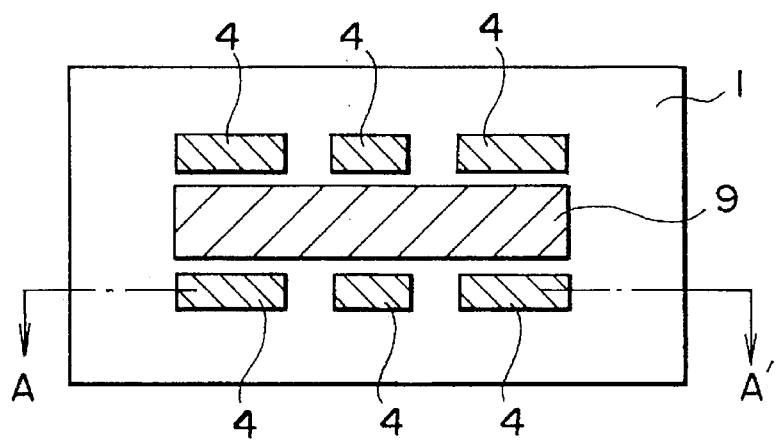
FIG. 5 is a bottom view showing the same semiconductor device shown in FIG. 4.
Figure 6:
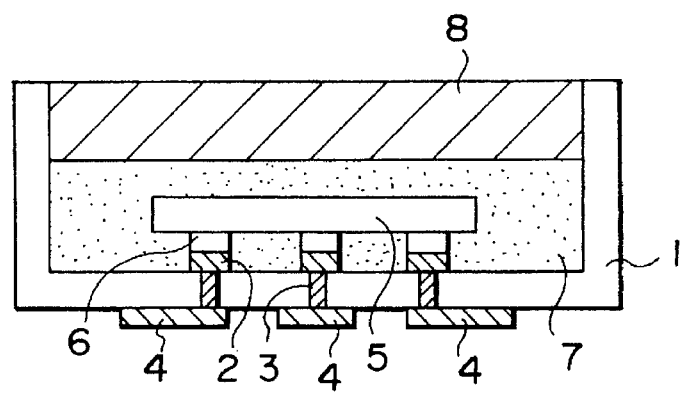
FIG. 6 is a cross-sectional view taken along the line A—A' in FIG. 4 or 5.

FIGS. 4, 5 and 6 show the first embodiment thereof, in which FIG. 4 is a plan view thereof; FIG. 5 is a bottom view thereof; and FIG. 6 is a cross-sectional view taken along the line A—A' in FIG. 4 or 5.

In the semiconductor device of this first embodiment, an IC chip 5 is packaged in a ceramic package 1, as shown in FIG. 4. The ceramic package 1 is formed integral with a bottom substrate and side walls extending in the vertical direction along the outer peripheral end portions of the bottom substrate, as shown in FIG. 6. A few electrode patterns 2 are formed on the inner surface of the bottom substrate of the ceramic package 1, end these electrode patterns 2 are connected to external electrodes 4 through a few through holes 3, respectively, as shown in FIG. 6. The electrode patterns 2 of the bottom substrate of the ceramic package 1 are connected to electrodes 6 of a GaAs-based monolithic IC chip 5 in accordance using a flip chip bonding technique.

In addition, as shown in FIGS. 4 and 5, an insulating resin 7 of a low dielectric constant is applied and then baked on the substrate of the package 1 so as to cover the IC chip 5, and further a conductive resin 8 is further applied and baked so as to cover all over the surface of the insulating resin 7. Here, the insulating resin 7 is a fluorine-based resin of a low (1 or 2) dielectric constant of (e.g., CYTOP (Trademark of ASAHI GLASS Corp.), or silicone gel or polyimide. The conductive resin 8 is a silver paste containing silver powder or a paste containing ferrite powder, for instance. Such paste containing ferrite powder has good shielding characteristics.

Furthermore, as shown in FIG. 5, on the bottom side of the package 1, a ground electrode 9 is formed together with the external electrodes 4. In the above-mentioned structure, the semiconductor device according to the present invention is so constructed so as to provide a sheet resistance of 100 $\Omega/\square$ or less. According to this embodiment, since the semiconductor chip is thoroughly covered by insulating resin, its moisture resistance will be remarkably improved.

The method of packaging the semiconductor chip according to the present invention will be described hereinbelow.

The ceramic package 1 as described above is first prepared, in which the electrode patterns 2 formed on the inner substrate surface thereof have been already pre-soldered. After that, the IC chip 5 having the bumps (electrodes) 6 are positioned in face down manner so as to be brought into contact with the pre-soldered electrode patterns 2, respectively, and then soldered. As described above, the electrodes 6 of the IC chip 5 are directly connected to the electrode patterns 2 formed on the substrate surface of the ceramic package 1 in accordance with the flip chip technique.

After that, the insulating (e.g., fluorine-based) resin 7 of a low dielectric constant , e.g. 1 or 2, is applied so as to cover the IC chip 5 soldered on the inner surface of the ceramic package 1. Further, the insulating resin 7 is baked for solidification by heat treatment at about 150° C. for about 30 min within an oven having nitrogen gas ($N_2$) atmosphere.

Further, the conductive resin 8 (e.g., silver paste (EN-40000) is applied all over the surface of the baked insulating resin 7 to such an extent as to be roughly flush with the upper ends of the side walls of ceramic the package 1, and then baked for solidification by heat treatment at about 150° C. for about 30 min within an oven having $N_2$ atmosphere, thus completing the packaged semiconductor device as shown in FIGS. 4, 5 and 6.

As described above, in the semiconductor device according to the present invention, since the IC chip can be packaged without connecting wire by bonding and without covering the IC chip with a cap, it is possible to reduce the package thickness from about 2 mm (prior art) to about 1 mm (invention). In addition, since the IC chip is covered conductive substances, it is possible to shield the IC chip 5 having the high frequency transistor to such an extent that high-frequency noise signals will not be emitted from the package to the outside.

Furthermore, since the IC chip 5 is covered with the insulating resin 7 of a low dielectric constant, it is possible to prevent parasitic capacitances from being formed between two of the electrodes 6 of the IC chip 5; that is, to prevent the IC chip 5 form being deteriorated in the high-frequency characteristics.

Further, since the fluorine-based resin of excellent waterproof characteristics is used as the insulating resin 7, it is possible to improve the moisture resistance of the semiconductor device, and thereby to increase the reliability of the semiconductor device.

A second embodiment of the semiconductor device according to the present invention will be described hereinbelow with reference to FIG. 7.

In this embodiment, a GaAs semiconductor chip 20 is packaged as a hybrid IC. Further, a metal conductor 12 provided on the bottom surface of a ceramic substrate 11 is connected to an electrode pattern 14 formed on the surface of the ceramic substrate 11 via a contact hole 13.

In more detail, electrode patterns 15 and 16 and metal conductors 7 and 18 are formed on the surface of the ceramic substrate 11. Further, a first insulating (fluorine based) resin 19 of a low (one or two) dielectric constant is applied and baked on the ceramic substrate 11 so as to cover the metal conductors 17 and 18. The first insulating resin 19 is formed with an opening portion 19a, in which the electrode patterns 14, 15 and 16 are to be formed.

The electrode patterns 14, 15 and 16 formed in the opening portion 19a on the ceramic substrate 11 are directly connected to the electrodes 21, 22 and 23 of the GaAs chip 20 in accordance with the flip chip technique. Further, a second insulating resin 24 of the same in material as the first insulating resin 19 is applied and baked to such an extent as to reach the height of the GaAs chip 20 (in such a way that the chip 20 can be buried) at the opening 19a and on the ceramic substrate 11. Further, a conductive resin (e.g., silver paste) 25 is applied and baked for solidification so as to cover the opening portion 19a in which the second insulating resin 24 has been baked.

In the second embodiment as described above, since the GaAs chip 20 can be packaged on the ceramic substrate 11 without use of any wire bonding, it is possible to reduce the thickness of the vicinity of the chip 20, while shielding the GaAs chip 20. Further, since the second insulating resin 24 of a low dielectric constant is applied so as to bury the chip 20, it is possible to prevent a parasitic capacitance from being generated between two the electrodes 21 to 23 of the GaAs chip 20; that is, to prevent the GaAs chip 20 form being deteriorated in the high-frequency characteristics.

Furthermore, in this second embodiment, it is also possible to use the metallic wire 12 formed on the reverse side of the ceramic substrate 11 as a ground conductor or a heat radiating conductor.

Figure 7:
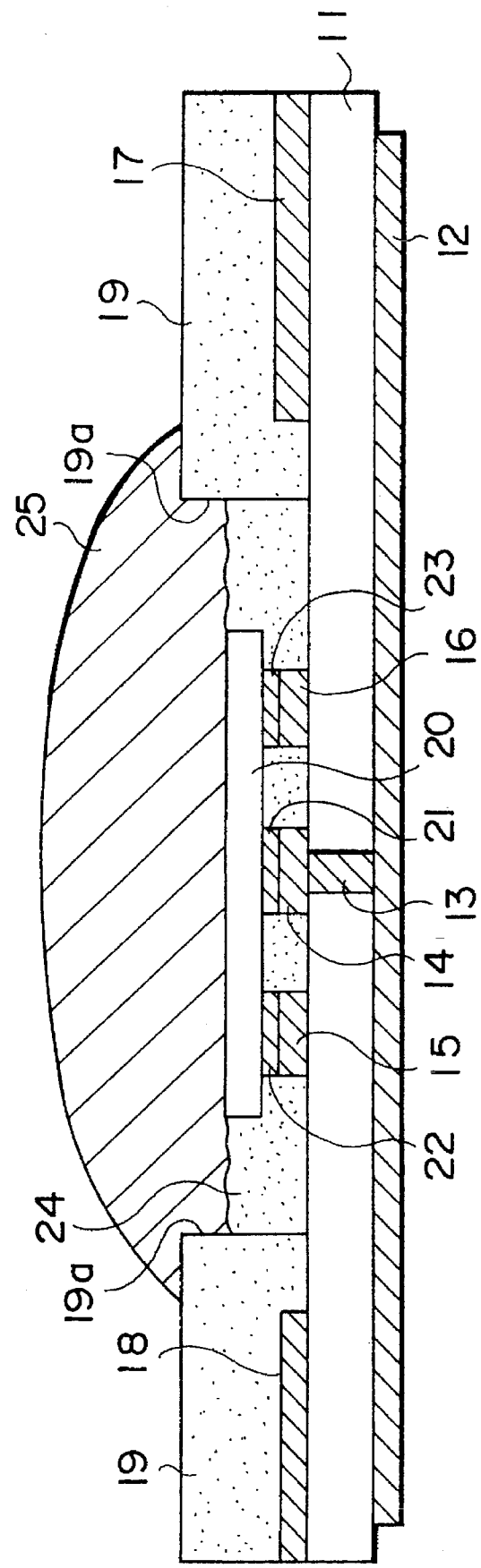
FIG. 7 is a cross-sectional view showing the structure of a second embodiment of the semiconductor device according to the present invention.
Figure 8:
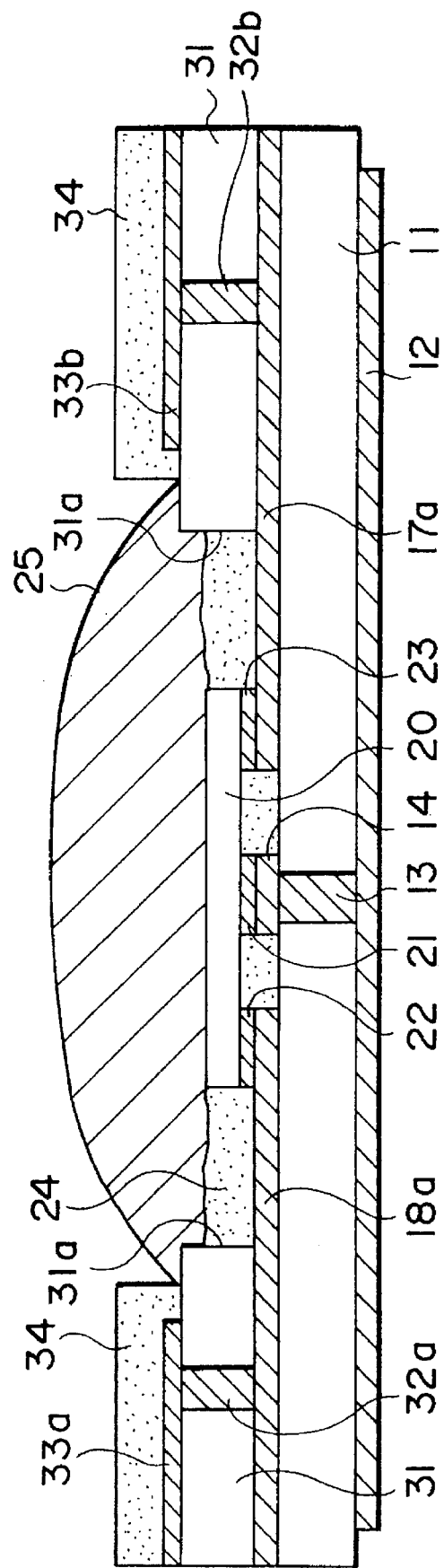
FIG. 8 is a cross-sectional view showing the structure of a third embodiment of the semiconductor device according to the present invention.

FIG. 8 shows a third embodiment of the semiconductor device according to the present invention, in which the same reference numerals have been retained for the similar parts or elements which have the same functions as with the case of the second embodiment shown in FIG. 7.

In the semiconductor device of this third embodiment, the GaAs semiconductor chip 20 is packaged as a hybrid IC in a multilayer substrate. In more detail, a second-stage ceramic substrate 31 formed with an opening portion 31a is stacked on a first-stage ceramic substrate 11 via first metallic conductors 17a and 18a.

Further, the first metallic conductors 17a and 18a both extend to the opening portion 31a of the second-stage ceramic substrate 31 and connected to second metallic conductors 33a and 33b formed on the surface of the second-stage ceramic substrate 31 through via holes 32a and 32b, respectively. In addition, a first insulating resin (fluorine based resin) 34 is applied and baked on the surface of the second-stage ceramic substrate 31 so as to cover the metallic conductors 33a and 33b.

Further, the electrodes 21, 22 and 23 of the GaAs chip 20 are directly connected to the electrode pattern 14 and the first metallic conductors 17a and 18a formed on the first-stage ceramic substrate 11 at the opening portion 31a of the second-stage ceramic substrate 31 in accordance with the flip chip technique. Further, the second insulating resin 24 the same in material as the first insulating resin 34 is applied and baked on the first-stage ceramic substrate 11 to such an extent as to reach the height of the GaAs chip 20 (in such a way that the chip 20 can be buried) at the opening 31a of the second ceramic substrate 31. Further, a conductive resin (e.g., silver paste) 25 is applied and baked so as to cover the second insulating resin 24 and the opening portion 31a of the second ceramic substrate 31.

In the third embodiment as described above, it is possible to obtain the same advantageous effect as with the case of the second embodiment. Furthermore, the metallic conductors 17a and 18a are connected to the metallic conductors 33a and 33b through the via hole 32a, respectively and used as internal conductors. In other words, the upper and lower internal leads can be formed on both sides of the second-stage ceramic substrate 31, so that the number of leads can be increased easily.

What is claimed is:

1. A semiconductor device, comprising:
    a shielding package having a substrate with a plurality of electrode patterns provided on a surface thereof and side walls upwardly formed in the peripheral end part of the surface thereof;
    a semiconductor chip having a plurality of electrodes directly connected to the electrode patterns of said shielding package, respectively;
    an insulating resin layer of a low dielectric constant formed on the substrate enclosed by said side walls so as to cover; and
    a conductive resin layer formed on an entire surface of said insulating resin layer, the conductive resin layer being formed of a paste including metal powder.

2. The semiconductor device according to claim 1, wherein said insulating resin is formed of a fluorine-based resin.

3. The semiconductor device according to claim 1, wherein an upper surface of said conductive layer is made flush with a top surface of said side wall.

4. The semiconductor device according to claim 1, wherein said plurality of electrodes of the semiconductor chip are solder bumps.

5. A semiconductor device, comprising:
    a shielding substrate formed with a plurality of electrode patterns on a surface thereof;
    a first insulating resin layer of a low dielectric constant formed on said shielding substrate, said first insulating resin layer having an opening therein;

a semiconductor chip having a plurality of electrodes directly connected to the electrode patterns formed on said shielding substrate, respectively, within said opening portion of said first insulating resin layer;

a second insulating resin layer of a low dielectric constant formed at the opening portion of said first insulating resin layer so as to bury said semiconductor chip; and a conductive resin layer for covering said second insulating resin layer at the opening portion of said first insulating resin layer, the conductive resin layer being formed of a paste including metal powder.

6. The semiconductor device according to claim 5, wherein said shielding substrate has a metallic conductor connected to some of the electrode patterns on a bottom surface thereof.

7. The semiconductor device according to claim 6, wherein said shielding substrate has a via hole through which said metal conductor and said electrode patterns are connected.

8. The semiconductor device according to claim 5, wherein said insulating resin is formed of a fluorine-based resin.

9. The semiconductor device according to claim 5, wherein an upper surface of said semiconductor chip is made flush with a top surface of said second insulating resin layer.

10. A semiconductor device, comprising:

a first shielding substrate formed with electrode patterns and first metallic conductors on a surface thereof;

a second shielding substrate formed on said first shielding substrate, said second shielding substrate being formed with an opening portion and with second metallic conductors connected to the first metallic conductors of said first shielding substrate, respectively;

a first insulating resin layer of a low dielectric constant formed on said second shielding substrate, inner end of the first insulating resin layer being located outside of said opening portion of the second shielding substrate;

a semiconductor chip mounted at the opening portion of said second shielding substrate and having electrodes directly connected to the electrode patterns and the first metallic conductors formed on said first shielding substrate;

a second insulating resin layer of a low dielectric constant formed at the opening portion of said second shielding substrate so as to enclose said semiconductor chip; and a conductive resin layer for covering said second insulating resin at the opening portion of said second shielding substrate to such an extent as to reach said first insulating resin, the conductive resin layer being formed of a paste including metal powder.

11. The semiconductor device according to claim 10, wherein said first shielding substrate has a third metallic conductor connected to some of the electrode patterns on a bottom surface thereof.

12. The semiconductor device according to claim 10, wherein said first shielding substrate has a via hole through which said third metal conductor and said electrode patterns are connected.

13. The semiconductor device according to claim 12, wherein said second shielding substrate has a via hole through which said second metal conductor and said first metal conductor are connected.

14. The semiconductor device according to claim 10, wherein said insulating resin is formed of a fluorine-based resin.

15. The semiconductor device according to claim 10, wherein an upper surface of said semiconductor chip is made flush with a top surface of said second insulating resin layer.

16. A semiconductor device, comprising:

a shielding package having a substrate with a plurality of electrode patterns provided on a surface thereof and side walls upwardly formed in the peripheral end part of the surface thereof, the package being provided with a sheet resistance of 100 $\Omega/\square$ or less;

a semiconductor chip having a plurality of electrodes directly connected to the electrode patterns of the shielding package, respectively;

an insulating resin layer of a low dielectric constant formed on the substrate enclosed by the side walls so as to cover; and a conductive resin layer formed on an entire surface of the insulating resin layer.

17. A semiconductor device, comprising:

a shielding substrate formed with a plurality of electrode patterns on a surface thereof, the substrate being provided with a sheet resistance of 100 $\Omega/\square$ or less;

a first insulating resin layer of a low dielectric constant formed on the shielding substrate, the first insulating resin layer having an opening therein;

a semiconductor chip having a plurality of electrodes directly connected to the electrode patterns formed on the shielding substrate, respectively, within the opening portion of the first insulating resin layer;

a second insulating resin layer of a low dielectric constant formed at the opening portion of the first insulating resin layer so as to bury the semiconductor chip; and a conductive resin layer for covering the second insulating resin layer at the opening portion of the first insulating resin layer.

18. A semiconductor device, comprising:

a first shielding substrate formed with electrode patterns and first metallic conductors on a surface thereof, the first substrate being provided with a sheet resistance of 100 $\Omega/\square$ or less;

a second shielding substrate formed on the first shielding substrate, the second shielding substrate being formed with an opening portion and with second metallic conductors connected to the first metallic conductors of the first shielding substrate;

a first insulating resin layer of a low dielectric constant formed on the second shielding substrate, inner end of the first insulating resin layer being located outside of the opening portion of the second shielding substrate;

a semiconductor chip mounted at the opening portion of the second shielding substrate and having electrodes directly connected to the electrode patterns and the first metallic conductors formed on the first insulating substrate;

a second insulating resin layer of a low dielectric constant formed at the opening portion of the second insulating substrate so as to enclose the semiconductor chip; and a conductive resin layer for covering the second insulating resin layer at the opening portion of the second shielding substrate to such an extent as to reach the first insulating resin layer.

19. The semiconductor device according to claim 16, wherein said insulating resin is formed of a fluorine-based resin.

20. The semiconductor device according to claim 16, wherein said conductive resin layer is formed of a paste including metal powder.

21. The semiconductor device according to claim 16, wherein an upper surface of said conductive layer is made flush with a top surface of said side wall.

22. The semiconductor device according to claim 16, wherein said plurality of electrodes of the semiconductor chip are solder bumps.

23. The semiconductor device according to claim 17, wherein said shielding substrate has a metallic conductor connected to some of the electrode patterns on a bottom surface thereof.

24. The semiconductor device according to claim 17, wherein said shielding substrate has a via hole through which said metal conductor and said electrode patterns are connected.

25. The semiconductor device according to claim 17, wherein said insulating resin is formed of a fluorine-based resin.

26. The semiconductor device according to claim 17, wherein said conductive resin layer is formed of a paste including metal powder.

27. The semiconductor device according to claim 17, wherein an upper surface of said semiconductor chip is made flush with a top surface of said second insulating resin layer.

28. The semiconductor device according to claim 18, wherein said first shielding substrate has a third metallic conductor connected to some of the electrode patterns on a bottom surface thereof.

29. The semiconductor device according to claim 18, wherein said first shielding substrate has a via hole through which said third metal conductor and said electrode patterns are connected.

30. The semiconductor device according to claim 18, wherein said second shielding substrate has a via hole through which said second metal conductor and said first metal conductor are connected.

31. The semiconductor device according to claim 18, wherein said insulating resin is formed of a fluorine-based resin.

32. The semiconductor device according to claim 18, wherein said conductive resin layer is formed of a paste including metal powder.

33. The semiconductor device according to claim 18, wherein an upper surface of said semiconductor chip is made flush with a top surface of said second insulating resin layer.

* * * * *